(12) United States Patent
Arayashiki

(10) Patent No.: US 7,212,791 B2
(45) Date of Patent: May 1, 2007

(54) TRANSMISSION DEVICE AND DELAY TIME ADJUSTMENT METHOD THEREOF

(75) Inventor: Mamoru Arayashiki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 10/530,990

(22) PCT Filed: Feb. 3, 2004

(86) PCT No.: PCT/JP2004/001044

§ 371 (c)(1),
(2), (4) Date: Apr. 12, 2005

(87) PCT Pub. No.: WO2004/070959
PCT Pub. Date: Aug. 19, 2004

(65) Prior Publication Data
US 2006/0009169 A1    Jan. 12, 2006

(30) Foreign Application Priority Data
Feb. 6, 2003 (JP) ............................. 2003-029792

(51) Int. Cl.
*H04B 1/02* (2006.01)
(52) U.S. Cl. .................... 455/91; 455/95; 455/127.1; 455/127.2; 375/300; 375/302
(58) Field of Classification Search .................. 455/91, 455/424, 425, 456.5, 456.6, 550.1, 575.1, 455/561, 42, 66.1, 102, 95, 108, 114.2, 114.1, 455/114.3, 69, 118, 231, 127.1, 127.2, 127.3, 455/126, 110; 330/149, 51, 129, 133, 134, 330/285, 289; 332/125, 126, 149, 150, 145, 332/151; 375/296, 297, 224, 295, 302, 298, 375/300; 370/318, 394, 474, 464, 468, 345, 370/473

See application file for complete search history.

(56) References Cited
U.S. PATENT DOCUMENTS
3,569,837 A * 3/1971 Makiedonski ............... 455/109

(Continued)

FOREIGN PATENT DOCUMENTS
CN  1409482  4/2003

(Continued)

*Primary Examiner*—Edward F. Urban
*Assistant Examiner*—Charles Chow
(74) *Attorney, Agent, or Firm*—Pearne & Gordon LLP

(57) ABSTRACT

A transmitter and method to output a stable output signal having low distortion by adjusting a delay time of an amplitude signal path and a phase signal path. In an amplitude phase extracting part, amplitude data and phase data are extracted from a transmit data signal and outputted. The amplitude of the amplitude data is modulated in an amplitude modulating part and an amplitude modulating signal is outputted; the phase of the phase data is modulated and a phase modulating signal is outputted. In a non-linear amplifying part, the phase modulating signal is multiplied by the amplitude modulating signal to output an RF signal with a prescribed gain amplified. A delay part provided in a pre-stage of the amplitude modulating part and a delay part provided in a pre-stage of the phase modulating part, respectively, adjusts the delay time of an amplitude signal path and a phase signal path.

5 Claims, 5 Drawing Sheets

U.S. PATENT DOCUMENTS

| | | | |
|---|---|---|---|
| 4,176,319 A * | 11/1979 | Kahn | 455/109 |
| 4,194,154 A | 3/1980 | Kahn | |
| 5,420,536 A * | 5/1995 | Faulkner et al. | 330/149 |
| 6,445,249 B1 * | 9/2002 | Khan et al. | 330/149 |
| 6,480,704 B1 * | 11/2002 | Pakonen | 455/126 |
| 6,600,369 B2 * | 7/2003 | Mitzlaff | 330/149 |
| 6,631,254 B1 * | 10/2003 | Wilson et al. | 455/91 |
| 6,735,419 B2 * | 5/2004 | Mitzlaff | 455/127.1 |
| 6,914,943 B2 * | 7/2005 | Shimizu | 375/302 |
| 7,062,236 B2 * | 6/2006 | Midtgaard et al. | 455/126 |
| 7,068,984 B2 * | 6/2006 | Mathe et al. | 455/126 |
| 2001/0050963 A1 * | 12/2001 | Yoneyama | 375/302 |
| 2002/0176514 A1 * | 11/2002 | Schell | 375/298 |
| 2002/0193085 A1 | 12/2002 | Mathe et al. | |
| 2005/0079835 A1 * | 4/2005 | Takabayshi et al. | 455/127.1 |
| 2005/0195030 A1 * | 9/2005 | Okazali et al. | 330/149 |

FOREIGN PATENT DOCUMENTS

| | | |
|---|---|---|
| EP | 1 035 701 A1 | 9/2000 |
| EP | 1 225 690 A2 | 7/2002 |
| JP | 2002-530992 A | 9/2002 |
| WO | WO 01/58012 A2 | 9/2001 |
| WO | 01/86806 | 11/2001 |
| WO | WO 02/80484 A1 | 10/2002 |
| WO | WO 03/105344 A1 | 12/2003 |

* cited by examiner

| DATA NUMBER | OPERATING STATE OF TRANSMITTER | DELAY QUANTITY DATA |
|---|---|---|
| <1> | × × × × | # # # # |
| <2> | × × × × | # # # # |
| ... | ... | ... |

TRANSMISSION DEVICE AND DELAY TIME ADJUSTMENT METHOD THEREOF

TECHNICAL FIELD

The present invention relates to a transmitter and more particularly to a transmitter including a high frequency power amplifier for amplifying a modulation signal having an envelope variable component with a low distortion and a high efficiency.

BACKGROUND ART

For a power amplifier provided in an output part of the transmitter of a radio communication system, the compatibility of a low distortion and a high efficiency is required. The power amplifier has a classification that a transistor is used as a current source or a switch. The amplifier using the transistor as the current source includes an class A amplifier, an class AB amplifier, a class B amplifier and a class C amplifier. Further, the amplifier using the transistor as the switch includes a class D amplifier, an class E amplifier and an class F amplifier.

As the high frequency power amplifier for amplifying a modulation signal including an envelope variable component, an A class linear amplifier or an class AB linear amplifier has been used to linearly amplify the envelope variable component. However, the power efficiency of the linear amplifier has been disadvantageously lower than that of a class C or an class E non-linear amplifier. Accordingly, when the linear amplifier is used in a portable radio device such as a portable telephone, a portable information terminal, or the like having a battery as a power source, a using time has been inconveniently decreased. Further, in a base station device of a mobile telecommunication system in which a plurality of transmitters using a large quantity of power is installed, the device is undesirably enlarged and the quantity of generated heat is inconveniently increased.

Thus, as a transmitter having a highly efficient transmitting function, an EE & R (Envelope Elimination and Restoration) transmitter is proposed which includes an amplitude phase extracting part, an amplitude modulating part, a phase modulating part and a non-linear amplifying part, inputs a signal of a prescribed envelope level to the non-linear amplifying part and uses the non-linear amplifier having a good efficiency as a high frequency amplifier. Further, a transmitter has been also known in which the non-linearity of an envelope signal of a non-linear amplifier is compensated by a negative feedback to suppress an amplitude distortion.

FIG. 9 is a block diagram showing the structure of the above-described EE & R transmitter as a first existing example. The transmitter of the first existing example includes a transmit data input terminal 111, an amplitude phase extracting part 112, an amplitude modulating part 113, a phase modulating part 114, a non-linear amplifying part 115 and a transmit output terminal 116.

In FIG. 9, assuming that a transmit data signal $Si(t)$ inputted from the transmit data input terminal 111 is expressed by $$Si(t)=a(t)\exp[j\phi(t)] \quad (1),$$

amplitude data $a(t)$ and phase data $\exp[j\phi(t)]$ are extracted from the $Si(t)$ by the amplitude phase extracting part 112. The source voltage value of the non-linear amplifying part 115 is set by the amplitude modulating part 113 on the basis of the amplitude data $a(t)$. On the other hand, a signal is generated by modulating carrier wave angular frequency $\omega c$ by the phase data $\exp[j\phi(t)]$ in the phase modulating part 114 to be Sc and Sc is inputted to the non-linear amplifying part 115.

$$Sc=\exp[\omega ct+\phi(t)] \quad (2)$$

A signal is generated by multiplying the source voltage value $a(t)$ of the non-linear amplifying part 115 by the output signal of the phase modulating part 114. An RF signal Srf obtained by amplifying the obtained signal by a gain G of the non-linear amplifying part 115 is outputted to the output of the non-linear amplifying part 115.

$$Srf=Ga(t)Sc=Ga(t)\exp[\omega ct+\phi(t)] \quad (3)$$

As described above, since the signal inputted to the non-linear amplifying part 115 is the signal of a prescribed envelope level, a non-linear amplifier having a good efficiency as a high frequency amplifier can be used. Thus, the transmitter with a high efficiency can be realized.

In the first existing example, the detail of the amplitude modulating part 113 is not illustrated. However, the amplitude modulating part 113 uses a structure that includes, for instance, a DA (digital-analog) converting part, a pulse width modulating part, a switch and a low-pass filter which are connected in order and in series to input source voltage to the switch. In the amplitude modulating part 113, the amplitude data as a digital value is converted to an analog signal in the DA converting part and the pulse width of the analog signal is modulated in the pulse width modulating part. The switch is switched in accordance with the pulse output of the pulse width modulating part. The output of the switch is smoothed in the low pass filter to be an amplitude modulating signal and is applied as the source voltage of the non-linear amplifying part 115 (for instance, see Non-Patent Document 1).

Further, the phase modulating part 114 employs a structure using a PLL (Phase-Locked Loop). That is, the PLL, whose detail is not illustrated, is provided in which for instance, a phase frequency comparing part, a low-pass filter and a voltage control oscillator are connected in order and in series and a part of the output of the voltage control oscillator is fed back as a feedback signal to the phase frequency comparing part through a frequency divider. Further, an output of a $\Delta\Sigma$ (delta sigma) modulating part is inputted to the above-described frequency divider. In the phase modulating part 114, the frequency of a signal obtained by dividing the frequency of the output of the voltage control oscillator by the frequency divider is compared with a reference frequency in the phase frequency comparing part to output a difference between both the frequencies. The output of the phase frequency comparing part passes through the low-pass filter to become the control voltage of the voltage control oscillator and the output of the voltage control oscillator is locked by a prescribed phase and frequency. In the above-described PLL, the frequency dividing ratio of the frequency divider is changed in accordance with a signal obtained by performing a delta sigma modulation to phase data so that a phase modulation can be applied to the output of the voltage control oscillator (For instance, see Non-Patent Document 2).

FIG. 10 is a block diagram showing the structure of a transmitter having a negative feedback as a second existing or usual example. The transmitter of the second usual example includes a transmit data input terminal 111, an amplitude phase extracting part 112, an amplitude modulating part 113, a phase modulating part 114, a non-linear amplifying part 115, a transmit output terminal 116, a directional coupling part 117, an envelope detecting part 118, an AD (analog digital) converting part 119, an adding part 120 and an amplifying part 121. The same components as those of the transmitter shown in FIG. 9 are designated by the same reference numerals.

Now, an operation of the transmitter of the second existing or usual example will be described below. The transmitter of the second usual example feeds back the envelope component of an RF signal as an output of the non-linear amplifying part 115 in addition to the same operation as that of the transmitter as the first usual example shown in FIG. 9. The output of the non-linear amplifying part 115 is allowed to branch by the directional coupling part 117 and inputted to the envelope detecting part 118 to detect the envelope signal of the RF signal. The detected envelope signal is subjected to an analog digital conversion in the AD converting part 119 and the analog digital converted envelope signal is subtracted from the original amplitude data in the adding part 120, then amplified in the amplifying part 121 and inputted to the amplitude modulating part 113. The non-linearity of the envelope signal of the non-linear amplifying part 115 is compensated by the above-described feedback so that an amplitude distortion can be suppressed (For instance, see Non-Patent Document 3).

(Non-Patent Document 1) Peter B. Keningstopm, "HIGH-LINEARITY RF AMPLIFIER DESIGN" first edition, ARTECH HOUSE, INC., 2000, p 426–443

(Non-Patent Document 2) R. A. Meyers and P. H. Waters, "Synthesizer review for PAN-European digital cellular radio" poc. IEE Colloquium on VLSI Implementations for 2nd Generation Digital Cordless and Mobile Telecommunications Systems, 1990, p. 8/1–8/8

(Non-Patent Document 3) Peter B. Kenington, "HIGH-LINEARITY RF AMPLIFIER DESIGN" first edition, ARTECH HOUSE, INC., 2000, p. 156–161

However, in the transmitter of the first usual example shown in FIG. 9, since an amplitude signal and a phase signal reach the non-linear amplifying part 115 through different paths, an output signal is undesirably distorted due to the difference of delay time between the signal path of an amplitude modulation and the signal path of a phase modulation.

The transmitter of the second usual example shown in FIG. 10 has a structure for reducing an amplitude distortion by a negative feedback loop. To more increase a quantity of decrease of the amplitude distortion, a loop gain needs to be increased. Accordingly, the stability of the negative feedback loop is disadvantageously deteriorated.

The present invention is devised to solve the above-described problems and it is an object of the present invention to provide a transmitter in which power efficiency is good and a stable signal having little distortion can be outputted.

DISCLOSURE OF THE INVENTION

A transmitter according to the present invention comprises: an amplitude phase extracting unit for extracting amplitude data and phase data from inputted transmit data; a delay unit for delaying at least one of the amplitude data and the phase data; a phase modulating unit for modulating the phase of the phase data; a high frequency amplifying unit for using a phase modulating signal from the phase modulating unit as an input signal to amplify the power of a high frequency signal; and an amplitude modulating unit for modulating the amplitude of the amplitude data to output an amplitude modulating signal for controlling source voltage applied to the high frequency amplifying unit.

According to the above-described structure, the delay time of an amplitude signal path and a phase signal path can be adjusted by the delay unit, so that a distortion generated due to the difference in delay time between both the paths is reduced. Accordingly, the power can be highly efficiently amplified by the high frequency amplifying unit using the phase modulating signal and the amplitude modulating signal. The delay time is adjusted so that a stable signal having little distortion can be outputted.

As another embodiment of the present invention, the transmitter further comprises: an envelope detecting unit for detecting an envelope component of an output signal of the high frequency amplifying unit; and a negative feedback loop for negatively feeding back the envelope component to the amplitude data extracted by the amplitude phase extracting unit.

According to the above-described structure, the envelope component is negatively fed back by the negative feedback loop to compare the envelope component with the amplitude data. Thus, the amplitude distortion of an output signal can be suppressed. Further, since the delay time of the amplitude signal path and the phase signal path can be adjusted by the delay unit, a distortion generated due to the difference in delay time between both the paths is reduced. In this case, since the loop gain of the negative feedback loop can be lowered, stability can be improved.

Further, as a sill another embodiment of the present invention, the transmitter further includes a delay quantity switching and control unit for switching and controlling the quantity of delay of the delay unit. When the transmit data having different signal bandwidth is inputted as transmit data, the delay quantity switching and control unit switches the quantity of delay to the quantity of delay corresponding to the signal bandwidth.

According to the above-described structure, the quantity of delay is switched in accordance with the change of the signal bandwidth of the transmit data. Thus, even when the transmit data having the different signal bandwidth is switched, the delay time of the amplitude signal path and the phase signal path can be adjusted so that a distortion generated due to the difference in delay time between both the paths is reduced. Further, when the negative feedback loop is provided, the delay time is adjusted so as to meet the signal bandwidth. Thus, the stability of the negative feedback loop can be improved.

Further, as a still another embodiment of the present invention, the transmitter further includes: a delay quantity table for storing delay quantity data preset in accordance with the state of the transmitter; and a delay quantity switching and control unit for switching and controlling the quantity of delay of the delay unit on the basis of the delay quantity data of the delay quantity table.

According to the above-described structure, the quantity of delay is set in the delay quantity table to read the quantity of delay corresponding to the state of the transmitter so that the delay time of the amplitude signal path and the phase signal path can be adjusted. Thus, under an arbitrary operating state, a distortion generated due to the difference in delay time between the amplitude signal path and the phase signal path can be reduced. Further, when the negative feedback loop is provided, the stability of the negative feedback loop can be improved.

Further, as a still another embodiment of the present invention, the transmitter further includes: a high frequency output measuring unit for measuring the characteristics of the output signal of the high frequency amplifying unit; and a delay quantity calculating unit for calculating a prescribed delay quantity on the basis of the measured result of the high frequency output measuring unit to set the quantity of delay in the delay unit.

According to the above-described structure, as the characteristics of the output signal of the high frequency amplifying unit, for instance, a modulation accuracy or the leakage power of adjacent channels or the like is measured. Thus, a quantity of distortion of the output signal can be detected. Accordingly, a proper quantity of delay for reducing the distortion of the output signal of the transmitter is calculated on the basis of the measured result and set to the delay quantity table. Thus, the quantity of delay of the delay unit in the transmitter can be properly adjusted.

A method for adjusting a transmitter according to the present invention concerns a method for adjusting a transmitter including a delay unit for delaying at least one of amplitude data and phase data extracted from inputted transmit data; and a high frequency amplifying unit for using an amplitude modulating signal and a phase modulating signal obtained by modulating the amplitude data and the phase data to amplify the power of a high frequency signal. The method for adjusting a transmitter comprises: a high frequency output signal measuring step for measuring the characteristics of the output signal of the high frequency amplifying unit in the transmitter; and a delay quantity calculating step for calculating a proper delay quantity on the basis of the measured result to set the quantity of delay in the delay unit.

According to the above-described procedure, as the characteristics of the output signal of the high frequency amplifying unit, for instance, a modulation accuracy or the leakage power of adjacent channels or the like is measured. Thus, a quantity of distortion of the output signal can be detected. Accordingly, a proper quantity of delay for reducing the distortion of the output signal of the transmitter is calculated on the basis of the measured result and set to the delay quantity table. Thus, the quantity of delay of the delay unit in the transmitter can be properly adjusted.

Figure 1:
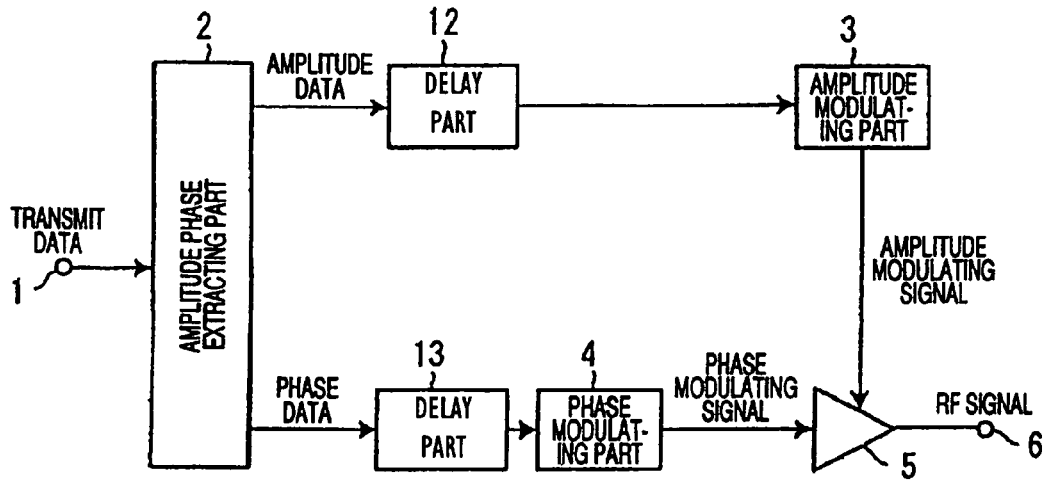
FIG. 1 is a block diagram showing the structure of main parts of a transmitter according to a first embodiment of the present invention.

In the drawings, reference numeral 1 designates a transmit data input terminal, 2 designates an amplitude phase extracting part, 3 and 24 designate amplitude modulating parts, 4 designates a phase modulating part, 5 and 25 designate non-linear amplifying parts, 6 and 26 designate transmit output terminals, 7 designates a directional coupling part, 8 designates an envelope detecting part, 9 designates an AD converting part, 10 designates an adding part, 11 designates an amplifying part, 12 and 13 designate delay parts, 20 designates a control signal input terminal, 21 designates a delay quantity switching and control part, 22 designates an amplitude data path switching part, 23 designates a phase data path switching part, 40 designates a switching signal input terminal, 41 designates a delay quantity table, 51 designates an RF signal measuring part, 52 designates a delay quantity calculating part, 60 designates a DA converting part, 61 designates a pulse width modulating part, 62 designates a switch, 63 designates a source voltage input terminal, 64 and 71 designate low-pass filters, 70 designates a phase frequency comparing part, 72 designates a voltage control oscillating part, 73 designates a frequency dividing part and 74 designates a ΔΣ modulating part.

<Best Mode for Carrying Out the Invention>

Now, embodiments of the present invention will be described by referring to the drawings.

(First Embodiment)

FIG. 1 is a block diagram showing the structure of main parts of a transmitter according to a first embodiment of the present invention.

The transmitter of the first embodiment comprises a transmit data input terminal 1, an amplitude phase extracting part (corresponding to an amplitude phase extracting unit) 2, an amplitude modulating part (corresponding to an amplitude modulating unit) 3, a phase modulating part (corresponding to a phase modulating unit) 4, a non-linear amplifying part (corresponding to a high frequency amplifying unit) 5, a transmit output terminal 6 and delay parts (corresponding to delay units) 12 and 13. The transmitter of this embodiment is characterized in that the delay part 12 is provided in a pre-stage of the amplitude modulating part 3 and the delay part 13 is provided in a pre-stage of the phase modulating part 4, respectively.

In a transmit data signal inputted from the transmit data input terminal 1, amplitude data and phase data are extracted and outputted in the amplitude phase extracting part 2. The amplitude data outputted from the amplitude phase extracting part 2 is delayed by a prescribed quantity of delay in the delay part 12. Then, an amplitude modulating signal obtained by modulating an amplitude in the amplitude modulating part 3 is inputted to the non-linear amplifying part 5 as a source voltage value. Further, the phase data outputted from the amplitude phase extracting part 2 is delayed by a prescribed quantity of delay in the delay part 13. Then, a phase modulating signal obtained by modulating a phase in the phase modulating part 4 is supplied to the non-linear amplifying part 5 as an input signal.

The non-linear amplifying part 5 has a semiconductor amplifying element to form a high frequency amplifier. In the non-linear amplifying part 5, the phase modulating signal from the phase modulating part 4 is multiplied by the amplitude modulating signal from the amplitude modulating part 3 as the source voltage value to output an RF signal with a prescribed gain amplified from the transmit output terminal 6. Here, since the input signal to the non-linear amplifying part 5 is a signal of a prescribed envelope level, a non-linear amplifier having a good efficiency as the high frequency amplifier can be formed.

Figure 2:
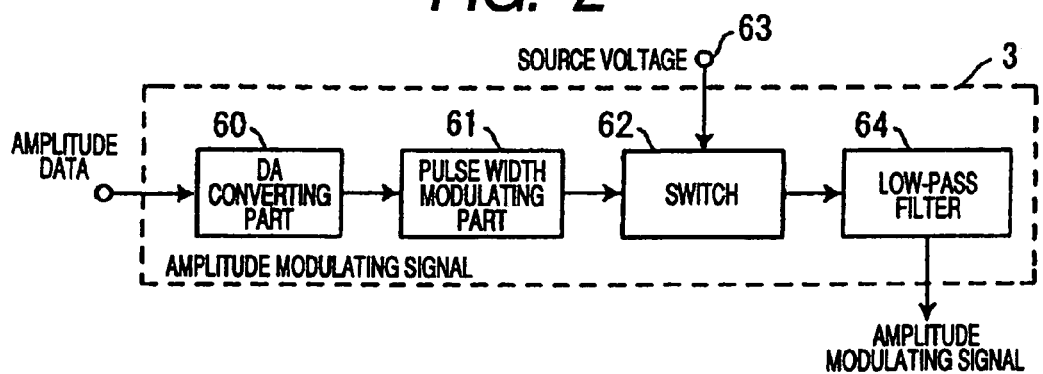
FIG. 2 is a block diagram showing a structural example of an amplitude modulating part in this embodiment.

FIG. 2 is a block diagram showing a structural example of the amplitude modulating part 3 in FIG. 1. The amplitude modulating part 3 includes a DA (digital-analog) converting part 60, a pulse width modulating part 61, a switch 62, a source voltage input terminal 63 and a low-pass filter 64. In the amplitude modulating part 3, the DA converting part 60, the pulse width modulating part 61, the switch 62 and the low-pass filter 64 are connected in order and in series. To the switch 62, source voltage is inputted from the source voltage input terminal 63.

In the amplitude modulating part 3, the amplitude data having a digital value is converted to an analog signal in the DA converting part 60 and the pulse width of the analog signal is modulated in the pulse width modulating part 61. The switch 62 is switched in accordance with the pulse output of the pulse width modulating part 61. The output of the switch 62 is smoothed in the low-pass filter 64 to become the amplitude modulating signal and the amplitude modulating signal is applied to the non-linear amplifying part 5 as the source voltage.

Figure 3:
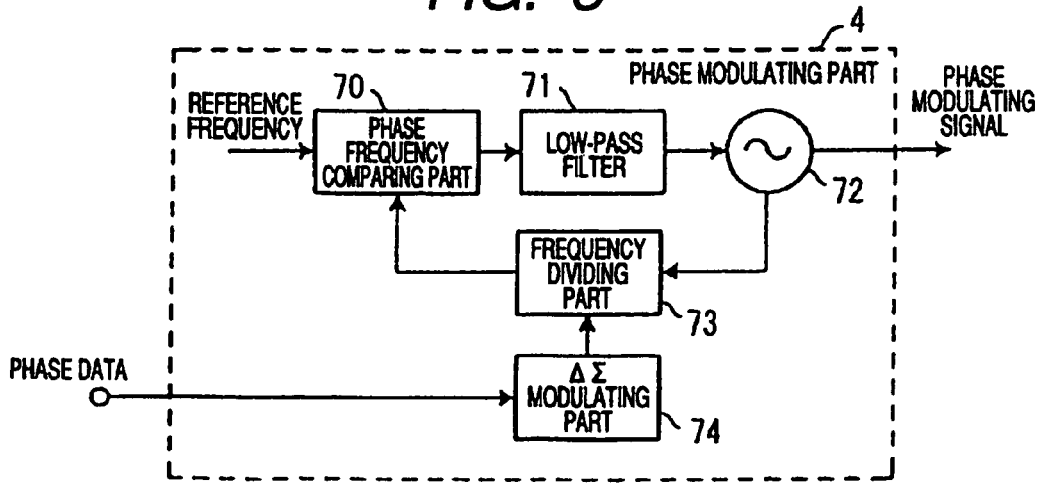
FIG. 3 is a block diagram showing a structural example of a phase modulating part in this embodiment.

FIG. 3 is a block diagram showing a structural example of the phase modulating part 4 in FIG. 1. The phase modulating part 4 includes a phase frequency comparing part 70, a low-pass filter 71, a voltage control oscillator (VCO) 72, a frequency dividing part 73 and a ΔΣ (delta sigma) modulating part 74. The phase modulating part 4 has a structure using a PLL (Phase-Locked Loop) in which the PLL that the phase frequency comparing part 70, the low pass filter 71 and the voltage control oscillator 72 are connected in order and in series and a part of the output of the voltage control oscillator 72 is fed back to the phase frequency comparing part 70 as a feedback signal through the frequency divider 73 is provided. Further, to the frequency divider 73, the output of the ΔΣ (delta sigma) modulating part 74 is inputted.

In the phase modulating part 4, the frequency of a signal obtained by dividing the frequency of the output of the voltage control oscillator 72 by the frequency divider 73 is compared with a reference frequency in the phase frequency comparing part 70 to output a difference between both the frequencies. The output of the phase frequency comparing part 70 becomes the control voltage of the voltage control oscillator 72 through the low-pass filter 71 and the output of the voltage control oscillator 72 is locked by a prescribed phase and frequency. In the above-described PLL, the frequency dividing ratio of the frequency divider 73 is changed in accordance with a signal obtained by performing a delta sigma modulation to the phase data in the delta sigma modulating part 74. Thus, a phase modulation can be applied to the output of the voltage control oscillator 72.

In the transmitter constructed as described above, the amplitude modulating part 3 has a delay generated in the amplitude modulating signal mainly by the low-pass filter 64. On the other hand, the phase modulating part 4 has a delay generated in the phase modulating signal mainly by the low-pass filter 71. Accordingly, a relative discrepancy is generated between an amplitude and a phase due to the difference in quantity of delay between the amplitude modulating part 3 and the phase modulating part 4.

In the first embodiment, the delay parts 12 and 13 are respectively provided in an amplitude signal path and a phase signal path. Thus, for instance, when a quantity of delay of the amplitude signal path is large, the quantity of delay of the delay part 12 of the amplitude signal path is set to zero and the quantity of delay of the delay part 13 of the phase signal path is adjusted. Thus, the quantity of delay of the amplitude signal path is allowed to correspond to the quantity of delay of the phase signal path. In such a way, a distortion due to the delay of the amplitude modulating signal can be reduced.

Further, when a quantity of delay of the phase signal path is large, the quantity of delay of the delay part 13 of the phase signal path is set to zero and the quantity of delay of the delay part 12 of the amplitude signal path is adjusted. Thus, the quantity of delay of the phase signal path is allowed to correspond to the quantity of delay of the amplitude signal path. In such a way, a distortion due to the delay of the phase modulating signal can be reduced.

In the above description, the quantity of delay of either of the delay parts 12 and 13 is set to zero. However, a rough adjustment may be performed by the quantity of delay of one of the phase signal path and the amplitude signal path and a fine adjustment may be performed by the quantity of delay of the other path.

As a specific delay quantity setting method of the delay parts 12 and 13, for instance, a method for setting a quantity of delay in accordance with the characteristics of a circuit upon design or a method for adjusting a quantity of delay to a suitable value for each of individuals upon production or the like may be employed.

As described above, according to the structure of the first embodiment, the delay part 12 is provided in a pre-stage of the amplitude modulating part 3 and the delay part 13 is provided in a pre-stage of the phase modulating part 4, respectively. Thus, the delay time of the amplitude signal path and the phase signal path can be adjusted and a distortion generated due to the difference in delay time between both the paths can be reduced.

(Second Embodiment)

Figure 4:
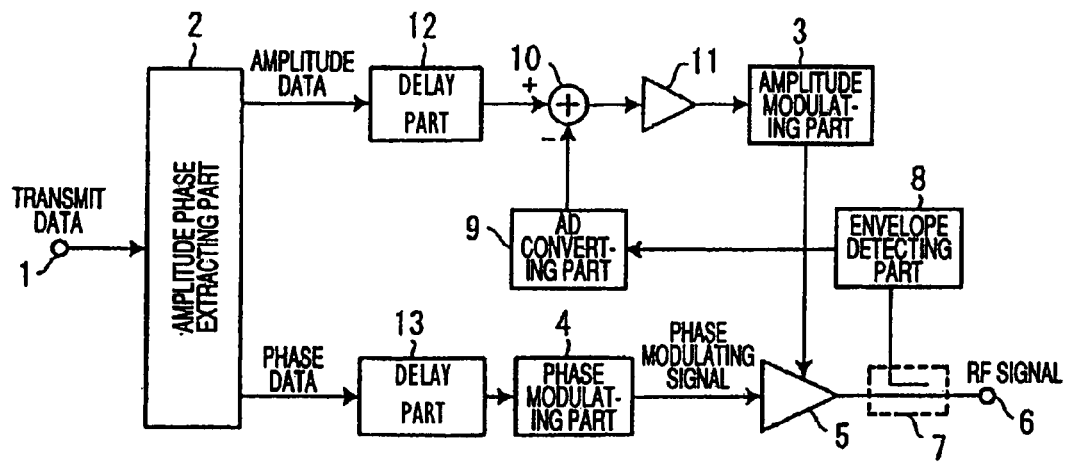
FIG. 4 is a block diagram showing the structure of main parts of a transmitter according to a second embodiment of the present invention.

FIG. 4 is a block diagram showing the structure of main parts of a transmitter according to a second embodiment of the present invention.

The transmitter of the second embodiment includes a directional coupling part 7, an envelope detecting part (corresponding to an envelope detecting unit) 8, an AD converting part (analog-digital converting part) 9, an adding part 10 and an amplifying part 11 in addition to the structure of the first embodiment shown in FIG. 1. Other structures are the same as those of the first embodiment and the same components are designated by the same reference numerals and the explanation thereof is omitted.

In the second embodiment, an envelope component of an RF signal as the output of a non-linear amplifying part 5 is fed back in addition to the operation of the first embodiment. A part of a signal component of the output of the non-linear amplifying part 5 is allowed to branch by the directional coupling part 7 and inputted to the envelope detecting part 8 to detect the envelope signal of the RF signal. The detected envelope signal is converted to a digital signal in the AD converting part 9. The digital signal is negatively inverted and inputted to the adding part 10 as a negative component. In the adding part 10, the envelope component is subtracted from original amplitude data, and then, the obtained data is amplified to a prescribed level in the amplifying part 11 and inputted to an amplitude modulating part 3.

In the second embodiment, a relative discrepancy is generated between an amplitude and a phase due to the difference in quantity of delay between the amplitude modulating part 3 and a phase modulating part 4 like the first embodiment. Thus, delay parts 12 and 13 are respectively provided in an amplitude signal path and a phase signal path. For instance, when a quantity of delay of the amplitude signal path is large, the quantity of delay of the delay part 12 of the amplitude signal path is set to zero and the quantity of delay of the delay part 13 of the phase signal path is adjusted. Thus, the quantity of delay of the amplitude signal path is allowed to correspond to the quantity of delay of the phase signal path. In such a way, a distortion due to the delay of an amplitude modulating signal can be reduced. Further, when a quantity of delay of the phase signal path is large, the quantity of delay of the delay part 13 of the phase signal path is set to zero and the quantity of delay of the delay part 12 of the amplitude signal path is adjusted. Thus, the quantity of delay of the phase signal path is allowed to correspond to the quantity of delay of the amplitude signal path. In such a way, a distortion due to the delay of a phase modulating signal can be reduced.

In the above description, the quantity of delay of either of the delay parts 12 and 13 is set to zero. However, a rough adjustment may be performed by the quantity of delay of one of the phase signal path and the amplitude signal path and a fine adjustment may be performed by the quantity of delay of the other path.

As described above, according to the structure of the second embodiment, the delay part 12 is provided in a pre-stage of the amplitude modulating part 3 and the delay part 13 is provided in a pre-stage of the phase modulating part 4, respectively. Thus, the delay time of the amplitude signal path and the phase signal path can be adjusted and a distortion generated due to the difference in delay time between both the paths can be reduced. Further, since an amplitude distortion can be reduced by adjusting the delay time of the amplitude signal path and the phase signal path, the loop gain of a negative feedback loop does not need to be increased. Thus, the loop gain of the negative feedback loop can be lowered to improve stability as a high frequency amplifier.

(Third Embodiment)

Figure 5:
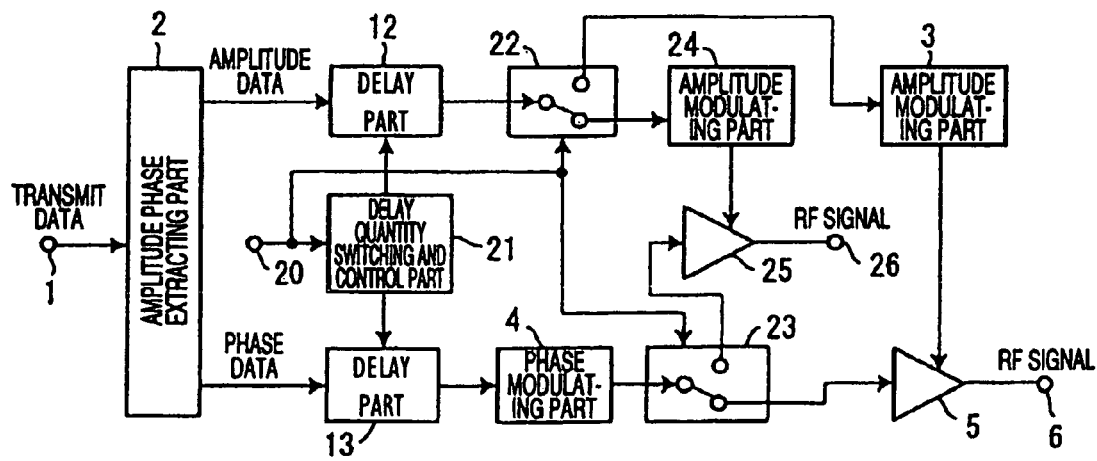
FIG. 5 is a block diagram showing the structure of main parts of a transmitter according to a third embodiment of the present invention.

FIG. 5 is a block diagram showing the structure of main parts of a transmitter according to a third embodiment of the present invention.

The transmitter of the third embodiment includes a control signal input terminal 20 for inputting delay and signal path switching and control signals, a delay quantity switching and control part (corresponding to a delay quantity switching and control unit) 21, an amplitude data path switching part 22, a phase data path switching part 23, a second amplitude modulating part 24, a second non-linear amplifying art 25 and a second transmit output terminal 26 in addition to the structure of the first embodiment shown in FIG. 1. Other structures are the same as those of the first embodiment and the same components are designated by the same reference numerals and the explanation thereof is omitted.

In the third embodiment, a quantity of delay can be switched in addition to the operation of the first embodiment. The second amplitude modulating part 24 and the second non-linear amplifying part 25 are components for transmitting different transmit data from that of the first amplitude modulating part 3 and the first non-linear amplifying part 5 in the first embodiment. The signal bandwidth of transmit data is also different from that of the first embodiment.

Further, the structure of the second amplitude modulating part 24 is the same as that of the first embodiment shown in FIG. 2, however, the signal bandwidth of the transmit data is different. Thus, the cut-off frequency of the low-pass filter 64 is changed. Further, the structure of a phase modulating part 4 is the same as that of the first embodiment shown in FIG. 3, however, the cut-off frequency of the low-pass filter 71 is changed so as to meet the signal bandwidth of transmit data.

In the third embodiment, the switches of the amplitude data path switching part 22 and the phase data path switching part 23 are switched so as to meet the bandwidth of the signal of employed transmit data by the delay quantity switching and control part 21. Thus, an amplitude signal path and a phase signal path are switched to use either the first amplitude modulating part 3 and the first non-linear amplifying part 5 or the second amplitude modulating part 24 and the second non-linear amplifying part 25.

Then, delay parts 12 and 13 are respectively provided in the amplitude signal path and the phase signal path. For instance, when a quantity of delay of the amplitude signal path is large, the quantity of delay of the delay part 12 of the amplitude signal path is set to zero and the quantity of delay of the delay part 13 of the phase signal path is adjusted. Thus, the quantity of delay of the amplitude signal path is allowed to correspond to the quantity of delay of the phase signal path. In such a way, a distortion due to the delay of an amplitude modulating signal can be reduced. Further, when a quantity of delay of the phase signal path is large, the quantity of delay of the delay part 13 of the phase signal path is set to zero and the quantity of delay of the delay part 12 of the amplitude signal path is adjusted. Thus, the quantity of delay of the phase signal path is allowed to correspond to the quantity of delay of the amplitude signal path. In such a way, a distortion due to the delay of a phase modulating signal can be reduced.

Accordingly, in the third embodiment, the amplitude signal path and the phase signal path are switched by the delay quantity switching and control part 21 to adjust the quantity of delay of each path. Thus, a delay time can be adjusted in accordance with the bandwidth of the signal of the employed transmit data and a distortion due to a delay can be reduced.

In the above description, the quantity of delay of either of the delay parts 12 and 13 is set to zero. However, a rough adjustment may be performed by the quantity of delay of one of the phase signal path and the amplitude signal path and a fine adjustment may be performed by the quantity of delay of the other path. Further, the delay quantity switching and control of the third embodiment may be applied to the structure of the second embodiment.

As described above, according to the structure of the third embodiment, the delay part 12 is provided in a pre-stage of the amplitude modulating part 3 and the delay part 13 is provided in a pre-stage of the phase modulating part 4, respectively. When the transmit data is switched, a quantity of delay is switched correspondingly to the switching of the transmit data. Thus, the delay time of the amplitude signal path and the phase signal path can be adjusted so as to meet the bandwidth of the signal of the transmit data. Thus, a distortion generated due to the difference in delay time between both the paths can be reduced. Further, when the delay quantity switching and control of the third embodiment is applied to the structure of the second embodiment, the delay time is adjusted to meet the bandwidth of the signal of the transmit data, so that the stability of a negative feedback loop can be improved.

(Fourth Embodiment)

Figures 6, 7:
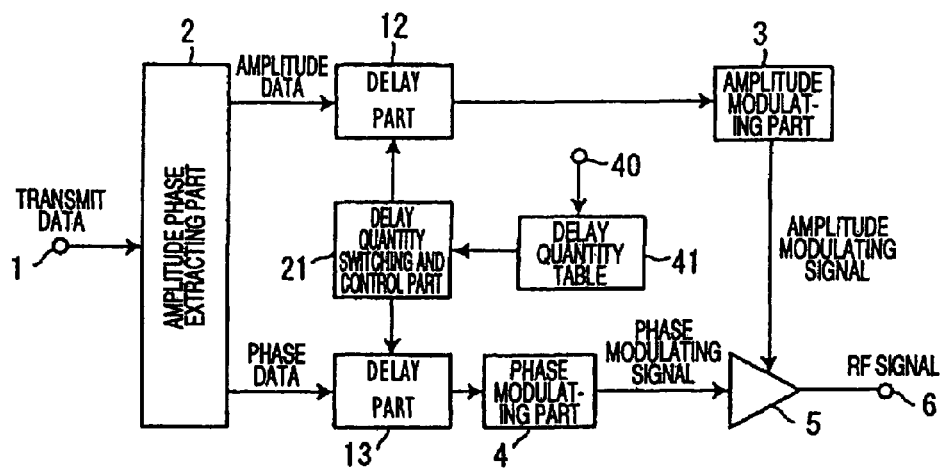
FIG. 6 is a block diagram showing the structure of main parts of a transmitter according to a fourth embodiment of the present invention.
FIG. 7 is a diagram showing one example of a delay quantity table.

FIG. 6 is a block diagram showing the structure of main parts of a transmitter according to a fourth embodiment of the present invention.

The transmitter of the fourth embodiment includes a delay quantity switching and control part 21, a switching signal input terminal 40 for inputting a delay quantity table data switching signal and a delay quantity table 41 in addition to the structure of the first embodiment shown in FIG. 1. Other structures are the same as those of the first embodiment and the same components are designated by the same reference numerals and the explanation thereof is omitted.

In the fourth embodiment, a quantity of delay is switched by delay quantity data previously set and stored in the delay quantity table 41 in addition to the operation of the first embodiment. Corresponding delay quantity data is read and outputted from a plurality of delay quantities set and stored in the delay quantity table 41 in accordance with the delay quantity table data switching signal inputted to the switching signal input terminal 40. A quantity of delay in delay parts 12 and 13 is switched by the switching control part 21 on the basis of the delay quantity data.

In the delay quantity table 41, the delay quantity data corresponding to the operating state of the transmitter is stored. Thus, an optimum value of the quantity of delay in the operating state of the transmitter can be set.

FIG. 7 shows one example of the delay quantity table 41. The delay quantity table 41 includes a data number 81, an operating state 82 of the transmitter and delay quantity data 83. In the operating state 62 of the transmitter, the operating states of the transmitter are stored. In the delay quantity data 63, optimum delay quantity data corresponding to the operating states of the transmitter is stored.

For instance, when a quantity of delay of an amplitude signal path is large, the quantity of delay of the delay part 12 of the amplitude signal path is set to zero and the quantity of delay of the delay part 13 of a phase signal path is adjusted. Thus, the quantity of delay of the amplitude signal path is allowed to correspond to the quantity of delay of the phase signal path. In such a way, a distortion due to the delay of an amplitude modulating signal can be reduced. Further, when a quantity of delay of the phase signal path is large, the quantity of delay of the delay part 13 of the phase signal path is set to zero and the quantity of delay of the delay part 12 of the amplitude signal path is adjusted. Thus, the quantity of delay of the phase signal path is allowed to correspond to the quantity of delay of the amplitude signal path. In such a way, a distortion due to the delay of a phase modulating signal can be reduced.

In the above description, the quantity of delay of either of the delay parts 12 and 13 is set to zero. However, a rough adjustment may be performed by the quantity of delay of one of the phase signal path and the amplitude signal path and a fine adjustment may be performed by the quantity of delay of the other path. Further, the delay quantity switching and control of the fourth embodiment may be applied to the structure of the second embodiment or the third embodiment.

As described above, according to the structure of the fourth embodiment, the delay part 12 is provided in a pre-stage of an amplitude modulating part 3 and the delay part 13 is provided in a pre-stage of a phase modulating part 4, respectively. A quantity of delay is properly switched on the basis of the delay quantity data of the delay quantity table 41. Thus, the delay time of the amplitude signal path and the phase signal path can be respectively adjusted so as to obtain the quantity of delay corresponding to the state of the transmitter. Thus, a distortion generated due to the difference in delay time between both the paths can be reduced. Further, when the delay quantity switching and control of the fourth embodiment is applied to the structure of the second embodiment, the delay time is adjusted to meet the operating state of the transmitter, so that the stability of a negative feedback loop can be improved. Further, when the delay quantity switching and control of the fourth embodiment is applied to the structure of the third embodiment, even if transmit data is switched, the delay time can be adjusted to meet the bandwidth of the signal of the transmit data.

(Fifth Embodiment)

Figure 8:
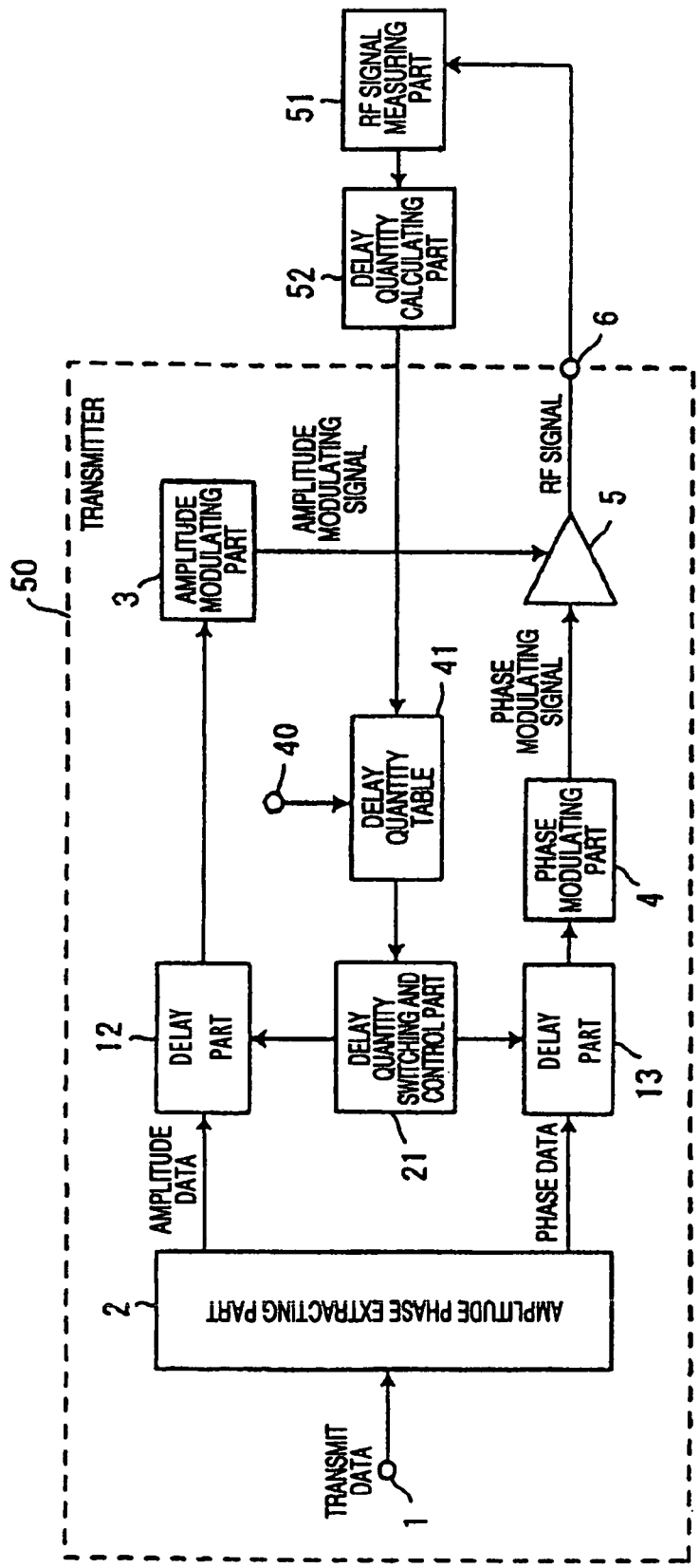
FIG. 8 is a block diagram showing the structure of main parts of a transmitter according to a fifth embodiment of the present invention.
Figure 9:
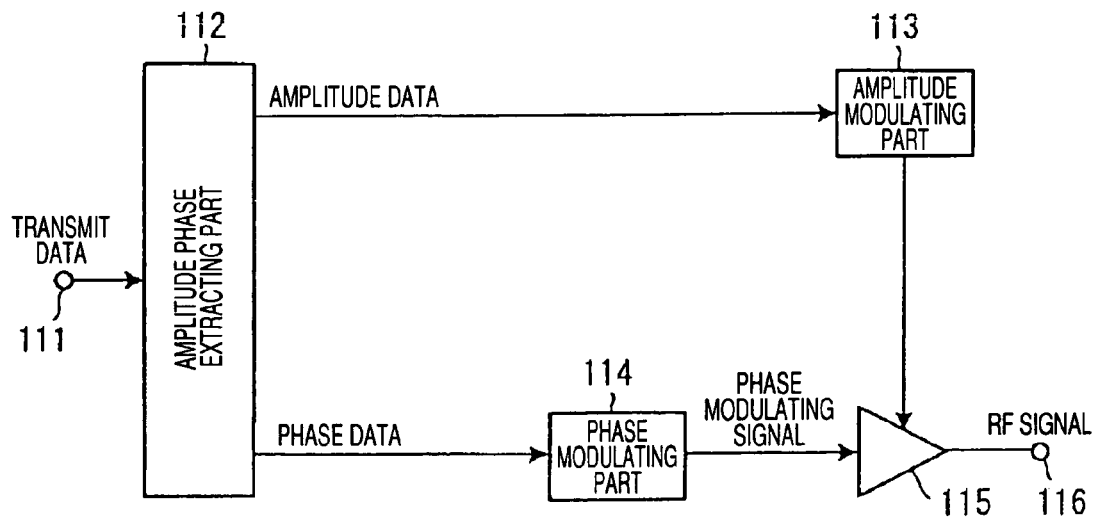
FIG. 9 is a block diagram showing the structure of an EE & R transmitter as a first usual example.
Figure 10:
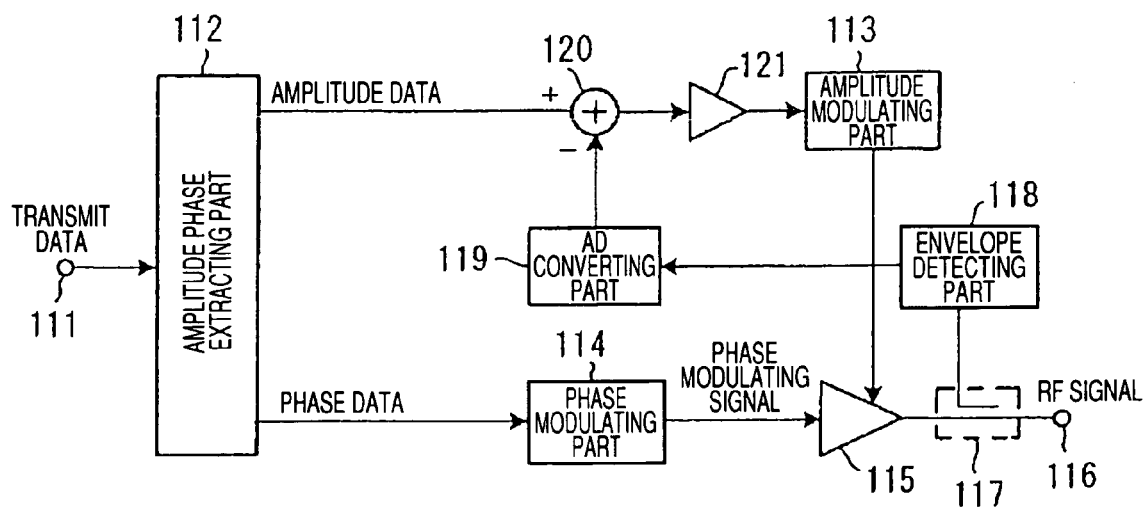
FIG. 10 is a block diagram showing the structure of a transmitter having a negative feedback as a second usual example.

FIG. 8 is a block diagram showing the structure of main parts of a transmitter according to a fifth embodiment of the present invention.

In the fifth embodiment, an adjusting device including an RF signal measuring part (corresponding to a high frequency output measuring unit) 51 and a delay quantity calculating part (corresponding to a delay quantity calculating unit) 52 is connected to a transmitter 50 having the structure of the fourth embodiment shown in FIG. 7. Other structures are the same as those of the fourth embodiment and the same components are designated by the same reference numerals and the explanation thereof is omitted.

In the fifth embodiment, a method for adjusting a quantity of delay by using the adjusting device having the RF signal measuring part 51 and the delay quantity calculating part 52 will be illustrated. In FIG. 8, for an output signal of the transmitter 50 outputted from an RF signal output terminal 6, for instance, a modulation accuracy or the leakage power of adjacent channels or the like is measured by the RF signal measuring part 51. Ordinarily, the characteristics such as the modulation accuracy or the leakage power of the adjacent channels are deteriorated due to the distortion of the output signal. Accordingly, a delay time is adjusted so that the difference in delay time between an amplitude signal path and a phase signal path, which causes the distortion of the output signal, is reduced on the basis of the measured results of the characteristics of an RF signal. At this time, the delay time of delay parts 12 and 13 is calculated by the delay quantity calculating part 52 so that the modulation accuracy or the leakage power of the adjacent channels has a desired value and stored in a delay quantity table. Then, delay quantity data stored in the delay quantity table 41 is read and outputted in accordance with the input of a delay quantity table data switching signal.

For instance, when a quantity of delay of the amplitude signal path is large, the quantity of delay of the delay part 12 of the amplitude signal path is set to zero and the quantity of delay of the delay part 13 of the phase signal path is adjusted. Thus, the delay quantity data is stored by which the quantity of delay of the amplitude signal path is allowed to correspond to the quantity of delay of the phase signal path. Further, for instance, when a quantity of delay of the phase signal path is large, the quantity of delay of the delay part 13 of the phase signal path is set to zero and the quantity of delay of the delay part 12 of the amplitude signal path is adjusted. Thus, the delay quantity data is stored by which the quantity of delay of the amplitude signal path is allowed to correspond to the quantity of delay of the phase signal path. In such a way, the delay quantity data is set so that a distortion generated due to the difference in delay between a phase modulating signal and an amplitude modulating signal can be reduced.

In the above description, the quantity of delay of either of the delay parts 12 and 13 is set to zero. However, a rough adjustment may be performed by the quantity of delay of one of the phase signal path and the amplitude signal path and a fine adjustment may be performed by the quantity of delay of the other path. Further, a delay quantity adjusting function of the fifth embodiment may be applied to the structure of the third embodiment.

As described above, according to the structures of the transmitter and the adjusting device and the delay quantity adjusting method of the fifth embodiment, a suitable delay quantity in which the distortion of the output signal of the transmitter is reduced can be calculated and set to the delay quantity table.

According to the above-described embodiment, the delay unit for adjusting the delay time of the amplitude signal path and the phase signal path is provided to adjust the delay time of both the paths to be equal. Thus, the distortion of the output of the transmitter generated due to the difference in delay time between both the paths can be reduced. Accordingly, in the transmitter, a high frequency power amplifier good in its power efficiency and capable of outputting a stable signal having little distortion can be realized.

The present invention is described in detail by referring to the specific embodiments. However, it is to be understood by a person with ordinary skill in the art that various changes or modifications may be made without departing the spirit and the scope of the present invention.

This application is based on Japanese Patent Application No. 2003-029792 filed in Feb. 6, 2003 and the contents thereof are taken in this application as a reference.

INDUSTRIAL APPLICABILITY

As described above, according to the present invention, the transmitter having a good power efficiency and capable of outputting a stable signal with little distortion can be provided.

The invention claimed is:

1. A transmitter comprising:
   an amplitude phase extracting unit, extracting amplitude data and phase data from inputted transmit data;
   a first delay unit, delaying the amplitude data;
   a second delay unit, delaying the phase data;
   a phase modulating unit, modulating the phase of the phase data;
   a high frequency amplifying unit, using a phase modulating signal from the phase modulating unit as an input signal to amplify the power of a high frequency signal;
   an amplitude modulating unit, modulating the amplitude of the amplitude data to output an amplitude modulating signal for controlling source voltage applied to the high frequency amplifying unit;
   a delay quantity table, storing delay quantity data preset in accordance with the state of the transmitter; and
   a delay quantity switching and control unit, switching and controlling the quantity of delay of the first delay unit and the second delay unit on the basis of the delay quantity data of the delay quantity table.

2. The transmitter according to claim 1, further comprising:
   an envelope detecting unit, detecting an envelope component of an output signal of the high frequency amplifying unit; and
   a negative feedback loop, negatively feeding back the envelope component to the amplitude data extracted by the amplitude phase extracting unit.

3. The transmitter according to claim 1, further including:
   a high frequency output measuring unit, measuring the characteristics of the output signal of the high frequency amplifying unit; and
   a delay quantity calculating unit, calculating a prescribed delay quantity on the basis of the measured result of the high frequency output measuring unit to set the quantity of delay in the first delay unit and the second delay unit.

4. A transmitter comprising:
   an amplitude phase extracting unit, extracting amplitude data and phase data from inputted transmit data;
   a first delay unit, delaying the amplitude data;
   a second delay unit, delaying the phase data;
   a phase modulating unit, modulating the phase of the phase data;
   a high frequency amplifying unit, using a phase modulating signal from the phase modulating unit as an input signal to amplify the power of a high frequency signal;
   an amplitude modulating unit, modulating the amplitude of the amplitude data to output an amplitude modulating signal for controlling source voltage applied to the high frequency amplifying unit; and
   a delay quantity switching and control unit, switching and controlling the quantity of delay of the first delay unit and the second delay unit,
   wherein when the transmit data having different signal bandwidth as the transmit data is inputted, the delay quantity switching control unit switches the quantity of delay to the quantity of delay corresponding to the signal bandwidth.

5. A method for adjusting a transmitter comprising:
   a first delay unit, delaying an amplitude data extracted from inputted transmit data;
   a second delay unit delaying an phase data extracted from inputted transmit data; and
   a high frequency amplifying unit, using an amplitude modulating signal and a phase modulating signal obtained by modulating the amplitude data and the phase data to amplify the power of a high frequency signal; said method for adjusting a transmitter comprising:
   measuring the characteristics of the output signal of the high frequency amplifying unit in the transmitter; and
   calculating a proper delay quantity on the basis of the measured result to set the quantity of delay in the first delay unit and the second delay unit.

* * * * *